(12) United States Patent
Nalla et al.

(10) Patent No.: US 8,304,913 B2
(45) Date of Patent: Nov. 6, 2012

(54) METHODS OF FORMING FULLY EMBEDDED BUMPLESS BUILD-UP LAYER PACKAGES AND STRUCTURES FORMED THEREBY

(75) Inventors: Ravi K Nalla, Chandler, AZ (US);
Pramod Malatkar, Chandler, AZ (US);
Mathew J Manusharow, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/890,045

(22) Filed: Sep. 24, 2010

(65) Prior Publication Data
US 2012/0074580 A1 Mar. 29, 2012

(51) Int. Cl.
*H01L 23/48* (2006.01)
(52) U.S. Cl. .................. 257/774; 257/777; 257/E23.011
(58) Field of Classification Search .................. 257/678, 257/685, 731, 774, 777, E23.011
See application file for complete search history.

(56) References Cited

U.S. PATENT DOCUMENTS

| | | | |
|---|---|---|---|
| 5,353,498 A | 10/1994 | Fillion et al. | |
| 5,366,933 A * | 11/1994 | Golwalkar et al. | 29/827 |
| 5,497,033 A | 3/1996 | Fillion et al. | |
| 5,527,741 A | 6/1996 | Cole et al. | |
| 5,841,193 A | 11/1998 | Eichelberger | |
| 6,154,366 A | 11/2000 | Ma et al. | |
| 6,159,767 A | 12/2000 | Eichelberger | |
| 6,239,482 B1 | 5/2001 | Fillion et al. | |
| 6,242,282 B1 | 6/2001 | Fillion et al. | |
| 6,271,469 B1 | 8/2001 | Ma et al. | |
| 6,274,937 B1 | 8/2001 | Ahn et al. | |
| 6,306,680 B1 | 10/2001 | Fillion et al. | |
| 6,396,148 B1 | 5/2002 | Eichelberger et al. | |
| 6,396,153 B2 | 5/2002 | Fillion et al. | |
| 6,423,570 B1 | 7/2002 | Ma et al. | |
| 6,426,545 B1 | 7/2002 | Eichelberger et al. | |
| 6,489,185 B1 | 12/2002 | Towle et al. | |
| 6,555,906 B2 | 4/2003 | Towle et al. | |
| 6,555,908 B1 | 4/2003 | Eichelberger et al. | |
| 6,580,611 B1 | 6/2003 | Vandentop et al. | |
| 6,586,276 B2 | 7/2003 | Towle et al. | |
| 6,586,822 B1 | 7/2003 | Vu et al. | |
| 6,586,836 B1 | 7/2003 | Ma et al. | |
| 6,617,682 B1 | 9/2003 | Ma et al. | |
| 6,703,400 B2 | 3/2004 | Johnson et al. | |
| 6,706,553 B2 | 3/2004 | Towle et al. | |

(Continued)

OTHER PUBLICATIONS

Skeete et al.; "Integrated Circuit Packages Including High Density Bump-Less Build Up Layers and a Lesser Density Core or Coreless Substrate", U.S. Appl. No. 11/860,922, filed Sep. 25, 2007, 19 pages.
Nalla et al.; "Microelectronic Package and Method of Manufacturing Same", U.S. Appl. No. 12/590,350, filed Nov. 6, 2009, 20 pages.
Guzek; "Recessed and Embedded Die Coreless Package", U.S. Appl. No. 12/655,321, filed Dec. 29, 2009, 26 pages.

(Continued)

*Primary Examiner* — Richard A. Booth
(74) *Attorney, Agent, or Firm* — Winkle, PLLC

(57) ABSTRACT

Methods of forming a microelectronic packaging structure and associated structures formed thereby are described. Those methods may include a die embedded in a coreless substrate, wherein a mold compound surrounds the die, and wherein the die comprises TSV connections on a first side and C4 pads on a second side of the die, a dielectric material on a first side and on a second side of the mold compound; and interconnect structures coupled to the C4 pads and to the TSV pads. Embodiments further include forming packaging structures wherein multiple dies are fully embedded within a BBUL package without PoP lands.

11 Claims, 9 Drawing Sheets

U.S. PATENT DOCUMENTS

| | | | |
|---|---|---|---|
| 6,709,898 | B1 | 3/2004 | Ma et al. |
| 6,713,859 | B1 | 3/2004 | Ma |
| 6,734,534 | B1 | 5/2004 | Vu et al. |
| 6,794,223 | B2 | 9/2004 | Ma et al. |
| 6,818,544 | B2 | 11/2004 | Eichelberger et al. |
| 6,825,063 | B2 | 11/2004 | Vu et al. |
| 6,841,413 | B2 | 1/2005 | Liu et al. |
| 6,888,240 | B2 | 5/2005 | Towle et al. |
| 6,894,399 | B2 | 5/2005 | Vu et al. |
| 6,902,950 | B2 | 6/2005 | Ma et al. |
| 6,964,889 | B2 | 11/2005 | Ma et al. |
| 7,067,356 | B2 | 6/2006 | Towle et al. |
| 7,071,024 | B2 | 7/2006 | Towle et al. |
| 7,078,788 | B2 | 7/2006 | Vu et al. |
| 7,109,055 | B2 | 9/2006 | McDonald et al. |
| 7,112,467 | B2 | 9/2006 | Eichelberger et al. |
| 7,160,755 | B2 | 1/2007 | Lo et al. |
| 7,183,658 | B2 | 2/2007 | Towle et al. |
| 7,189,596 | B1 | 3/2007 | Mu et al. |
| 7,205,180 | B1 * | 4/2007 | Sirinorakul et al. ......... 438/123 |
| 7,416,918 | B2 | 8/2008 | Ma |
| 7,420,273 | B2 | 9/2008 | Liu et al. |
| 7,425,464 | B2 | 9/2008 | Fay et al. |
| 7,442,581 | B2 | 10/2008 | Lytle et al. |
| 7,476,563 | B2 | 1/2009 | Mangrum et al. |
| 7,588,951 | B2 | 9/2009 | Mangrum et al. |
| 7,595,226 | B2 | 9/2009 | Lytle et al. |
| 7,619,901 | B2 | 11/2009 | Eichelberger et al. |
| 7,632,715 | B2 | 12/2009 | Hess et al. |
| 7,648,858 | B2 | 1/2010 | Tang et al. |
| 7,651,889 | B2 | 1/2010 | Tang et al. |
| 7,655,502 | B2 | 2/2010 | Mangrum et al. |
| 7,659,143 | B2 | 2/2010 | Tang et al. |
| 7,723,164 | B2 | 5/2010 | Lu et al. |
| 2008/0054448 | A1 | 3/2008 | Lu et al. |
| 2008/0192776 | A1 | 8/2008 | Fleming et al. |
| 2008/0280394 | A1 | 11/2008 | Murtuza et al. |
| 2008/0315377 | A1 | 12/2008 | Eichelberger et al. |
| 2008/0315391 | A1 | 12/2008 | Kohl et al. |
| 2009/0001568 | A1 * | 1/2009 | Mancera et al. ............. 257/737 |
| 2009/0007282 | A1 | 1/2009 | Tomizuka et al. |
| 2009/0079063 | A1 | 3/2009 | Chrysler et al. |
| 2009/0079064 | A1 * | 3/2009 | Tang et al. .................... 257/723 |
| 2009/0176348 | A1 | 7/2009 | Griffiths |
| 2009/0212416 | A1 | 8/2009 | Skeete |
| 2009/0294942 | A1 | 12/2009 | Palmer et al. |
| 2010/0044855 | A1 | 2/2010 | Eichelberger et al. |
| 2010/0047970 | A1 | 2/2010 | Eichelberger et al. |
| 2010/0193928 | A1 * | 8/2010 | Zudock et al. ................ 257/686 |

OTHER PUBLICATIONS

Guzek et al.; "Semiconductor Package With Embedded Die and its Methods of Fabrication", U.S. Appl. No. 12/655,335, filed Dec. 29, 2009, 36 pages.

Guzek et al.; "Die Stacking Using Through-Silicon Vias on a Bumpless Build-Up Layer Package", Unfiled US Patent Application.

Nalla et al.; "Forming Functionalized Carrier Structures With Coreless Packages", U.S. Appl. No. 12/761,782, filed Apr. 16, 2010, 36 pages.

Nalla et al.; "Microelectronic Package and Method of Manufacturing Same", U.S. Appl. No. 12/825,729, filed Sep. 29, 2009, 26 pages.

Guzek; "Mold Compounds in Improved Embedded-Die Coreless Substrates, and Processes of Forming Same", U.S. Appl. No. 12/821,847, filed Jun. 23, 2010, 36 pages.

Nalla et al.; "Forming In-Situ Micro-Feature Structures With Coreless Packages", U.S. Appl. No. 12/755,183, filed Apr. 6, 2010, 21 pages.

Nalla et al.; "Forming Metal Filled Die Back-Side Film for Electromagnetic Interference Shielding With Coreless Packages", U.S. Appl. No. 12/755,201, filed Apr. 6, 2010, 23 pages.

Guzek et al.; "System-In-Package Using Embedded-Die Coreless Substrates, and Processes of Forming Same", U.S. Appl. No. 12/725,925, filed Mar. 17, 2010, 34 pages.

Guzek et al.; "A Method for Improving the Reliability of an Embedded Die Coreless Package", unfiled US Patent Application.

Sankman et al.; "Embedded Semiconductive Chips in Reconstituted Wafers, and Systems Containing Same", U.S. Appl. No. 12/753,637, filed Apr. 2, 2010, 34 pages.

Nalla et al.; "Inverted Package With Bumpless Build-Up Layer (BBUL) Technology for Low Power Applications", unfiled US Patent Application.

Swaminathan et al.; "Magnetic Microelectronic Device Attachment", U.S. Appl. No. 12/778,335, filed May 12, 2010, 43 pages.

Nalla et al.; "Method for Making Laminated Core Products With Bumpless Build-Up Layer (BBUL) Technology", unfiled US Patent Application.

Malatkar; "Bumpless Build-Up Layer Package Design With an Interposer", U.S. Appl. No. 12/827,323, filed Jun. 30, 2010, 28 pages.

Crawford et al.; "Misalignment Correction for Embedded Microelectronic Die Applications", U.S. Appl. No. 12/830,875, filed Jul. 6, 2010, 41 pages.

Ma et al.; "Direct Build-Up Layer on an Encapsulated Die Package", U.S. Appl. No. 09/640,961, filed Aug. 16, 2000, 70 pages.

Nalla et al.; Dual Sided Fully Embedded Package Using Bumpless Build-Up Layer (BBUL) Technology, unfiled US patent application.

International Search Report and Written Opinion, PCT/US2011/053325 dated Sep. 26, 2011, 10 pages.

* cited by examiner

_US 8,304,913 B2_

METHODS OF FORMING FULLY EMBEDDED BUMPLESS BUILD-UP LAYER PACKAGES AND STRUCTURES FORMED THEREBY

BACK GROUND OF THE INVENTION

As semiconductor technology advances for higher processor performance, advances in packaging architectures may include coreless bumpless build-up Layer (BBUL-C) package architectures and other such assemblies. Current process flows for BBUL-C packages involve building of the substrate on a temporary core/carrier capped with copper foil, which is etched off after the package is separated from the core.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
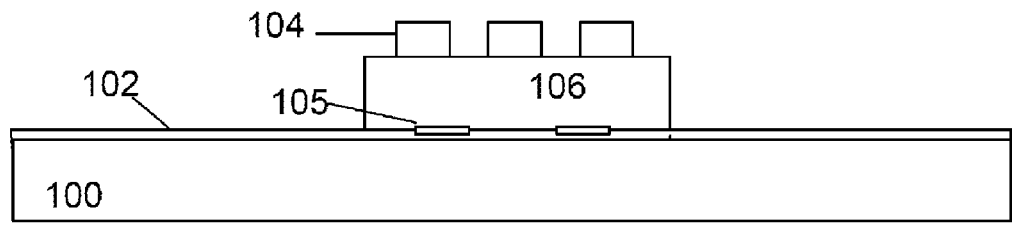
FIGS. 1a-1g represent methods of forming structures according to an embodiment of the present invention.

In the following detailed description, reference is made to the accompanying drawings that show, by way of illustration, specific embodiments in which the methods may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals refer to the same or similar functionality throughout the several views.

Methods and associated structures of forming and utilizing microelectronic packaging structures, such as fully embedded coreless BBUL package structures, are described. Those methods may include forming a die embedded in a coreless substrate, wherein a mold compound surrounds the die, and wherein the die comprises TSV connections on a first side and C4 pads on a second side of the die, wherein a dielectric material is disposed on a first side and on a second side of the mold compound, and wherein interconnect structures are coupled to the C4 pads and to the TSV pads through the dielectric material on both sides of the die. Methods of the embodiments enable the formation of dual sided, fully embedded packages using bumpless build-up layer (BBUL) technology.

Methods and associated structures of the embodiments further include forming a first die embedded in a coreless substrate, a first dielectric material adjacent the first die, and a second die embedded in the coreless substrate, wherein the second die is disposed above the first die and a second dielectric material is adjacent the second die. Interconnect structures further connect the first die to solder connections on an outer portion of the coreless substrate, wherein the coreless substrate does not comprise PoP (package on package) lands to couple the second die to the coreless package. The methods of the embodiments further enable the formation of a package structure wherein the overall package is made completely by the BBUL process rather than by a hybrid process involving a BBUL package process and a BGA/wire bond packaging process.

FIGS. 1a-1g illustrate embodiments of methods of forming microelectronic structures, such as package structures, for example. FIG. 1a illustrates a carrier material 100. In one embodiment, the carrier material 100 may comprise a multi-layer copper foil that may serve as a temporary carrier, such as a microelectronic die carrier 100. In other embodiments, the carrier material 100 may comprise any suitable conductive carrier material 100. In an embodiment, the carrier material 100 may optionally comprise an adhesive layer 102.

In an embodiment, a die 106 may be placed on the carrier material 100, which may in an embodiment comprise a temporary die carrier 100. The die 106 may comprise controlled collapse chip connections (C4) pads 104 and though silicon via (TSV) pads 105. In an embodiment, the C4 pads may be disposed on a first side 103 of the die 106, and the TSV pads may be disposed on a second side 101 of the die 106. The die 106 may be placed C4 side up, or in other embodiments may be placed TSV pad 105 side up on the die carrier 100. In an embodiment, the adhesive 102 can be dispensed either on the die 106 or on the carrier 100. In some cases, the 102 adhesive film and/or an attach process may be used to attach the die 106 to the temporary carrier 100.

Figure 1B:
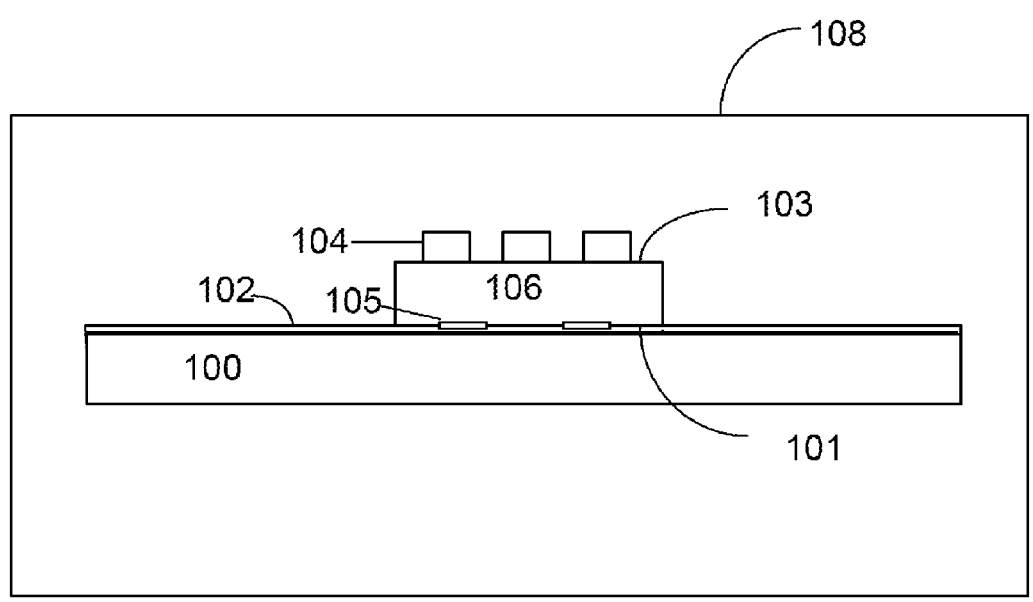
Figure 1C:
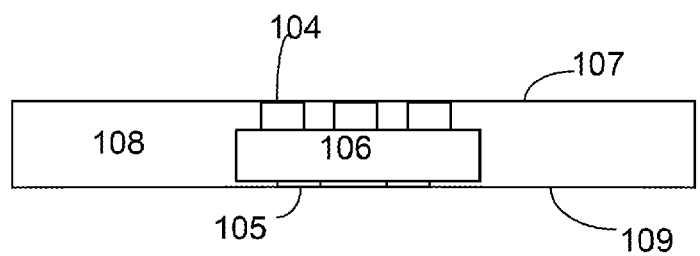

In an embodiment, a mold compound 108 may be applied to surround/embed the die 106 (FIG. 1b). In an embodiment, the mold compound 108 may be dispensed and cured to over-mold the die 106. The mold compound 108 may be applied such that the die 106 is completely embedded in the mold compound 108. A portion of the mold compound 108 may then be removed to expose the C4 pads 104 and TSV 105 pads (FIG. 1c). In an embodiment, back-grinding of the mold compound 108 may be performed to expose the C4 pads 104 and TSV pads 105, and the temporary carrier 100 may be removed from the die 106 during back-grinding removal process. In an embodiment, the die 106 may remain entirely embedded in the mold compound 108 after exposure of the C4 and TSV pads 104,105. The mold compound 108 may serve as a base for subsequently formed build-up layers of a microelectronic package structure formed according to embodiments herein, and may further serve to reduce warpage during subsequent processing of such a package structure. The remaining mold compound 108 may comprise a first surface 107 and a second surface 109.

Figure 1D:
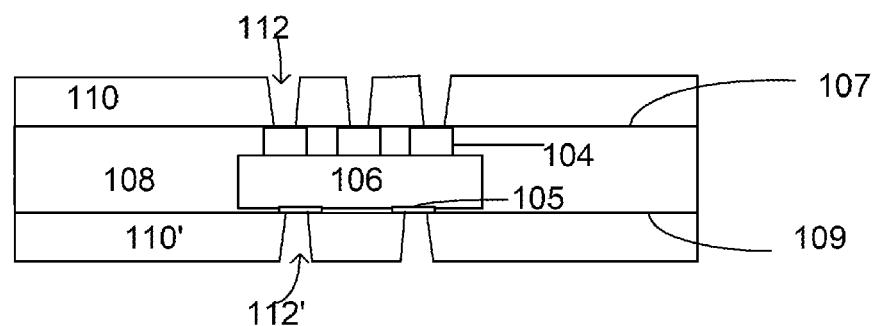

Dielectric material 110, 110' may be formed on the first surface 107 and on the second surface 109 of the mold compound 108 that surrounds the die 106 (FIG. 1d). In an embodiment, the dielectric material 110, 110' may be formed/attached by a laminating process, for example. The dielectric material 110, 110' may provide a level plane for a subsequent build-up process.

Figure 1E:
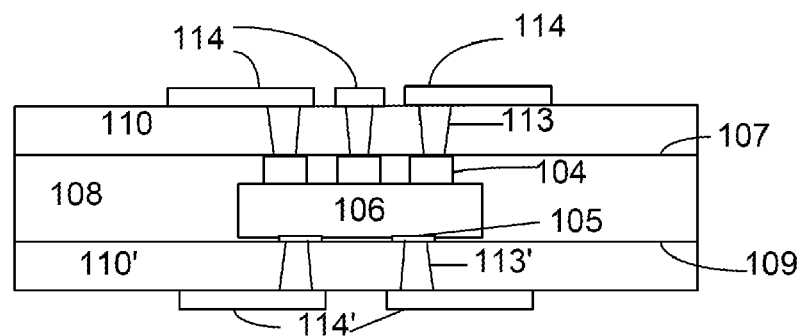

In an embodiment, vias 112 may be formed in the dielectric material 110 on the first surface 107 of the molding compound 108, to connect to the C4 pads 104 of the die 106, and vias 112' may also be formed in the dielectric material 110' on the second surface 109 of the molding compound 108 to connect to the TSV pads 105 of the die 106. The vias 112, 112' may subsequently be filled with conductive material 113 (FIG. 1e). In an embodiment, a semi-additive process (SAP) may be used to form interconnect structures 114 (which may comprise first metal layers, for example) to connectively couple to the C4 pads 104 on the die 106, and interconnect structures 114' may also be formed to connectively couple to the TSV pads 105 of the die 106. In an embodiment, the interconnect structures 114 may be disposed on the first surface 107 of the molding compound 108 and may be connected to the C4 pads 104 by the conductive vias 113. The interconnect structures 114' may be disposed on the second surface 109 of the molding compound 108 and may be connected to the TSV pads 105 by the conductive vias 113'.

Figure 1F:
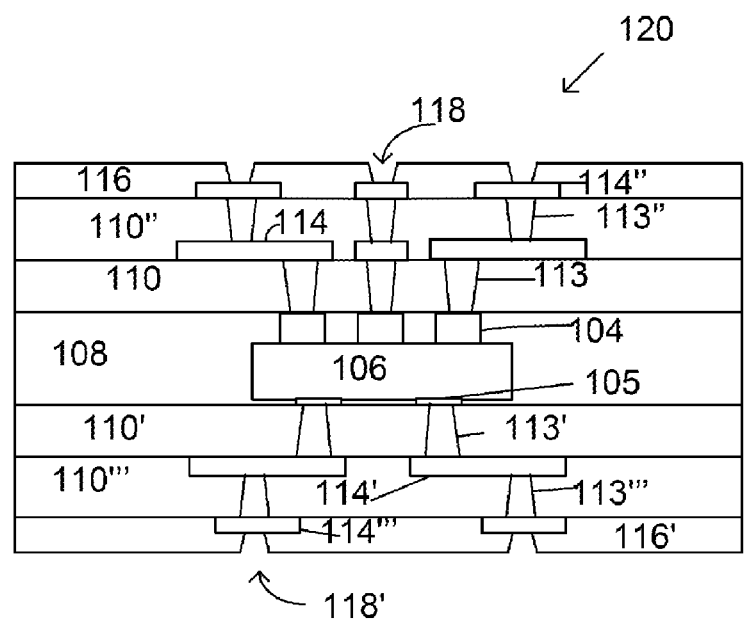

Subsequent layers may then be formed using SAP build-up processing, for example, wherein further dielectric layers, such as dielectric layers 110", 110''', conductive vias 113", 113''' and interconnect structures 114", 114''' may be formed upon each other according to the particular design requirements, to form a coreless package structure 120 by utilizing the buildup process (FIG. 1f). In an embodiment, the coreless package structure 120 may comprise a BBUL coreless package structure 120, and the die 106 may be fully embedded in the coreless package structure 120.

In an embodiment, the coreless package structure 120 may comprise a dual-sided package 120 on both sides of the die 106, which is embedded in mold compound 108.

Figure 1G:
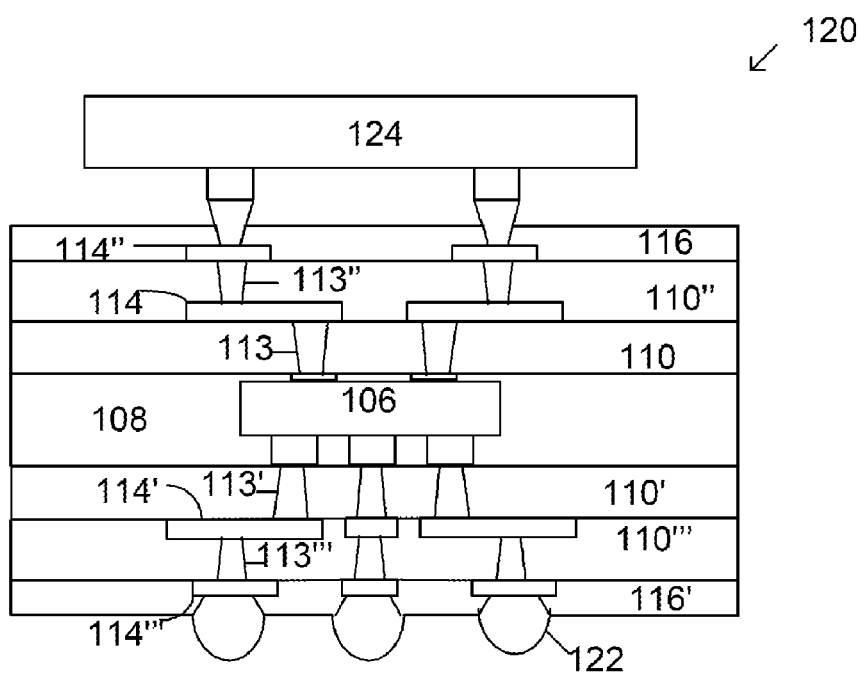

In an embodiment solder resist 116, 116' may be used to form openings 118, 118' to connectively couple to the C4 and/or the TSV pads 104, 105 on the outermost layer of the package structure 120. In an embodiment, solder resist can be used to open up the pads on the outermost layer of the package structure 120. In an embodiment, solder balls 122 may be formed in the openings 118' (and/or 118) to couple to the die 106. (FIG. 1g). In an embodiment, the solder balls 122 may comprise ball gird array (BGA) balls 122, that may be attached to the package structure 120. In an embodiment, a additional dies and/or packages 124 may be attached/coupled through the openings 118 (and/or 118', referring back to FIG. 1g) to an outer portion of the coreless package structure 120. In another embodiment, through mold-vias (not shown) may be formed through the dielectric layers to increase power supply to the coreless package structure 120, for example.

Thus, methods of fabricating dual sided fully embedded package structures using BBUL technology are enabled. The coreless package structure 120 may be utilized in stacked die/package applications. Embodiments provide stiffer package structures owing to the presence of the mold compound, and enable a fully embedded die solution, thus reducing the package Z-height. The embodiments further facilitate the integration of TSVs for stacked package applications, while improving warpage, while providing for simultaneous processing of a base package and stacked package(s). The embodiments enable packaging, assembly, and/or test solutions for graphics, wireless CPU's/processors, Chipsets Multi-Chip/3D package structures/systems, including CPU's in combination with other devices such as Memory (e.g., flash/DRAM/SRAM/etc) and boards such as motherboards, for example.

Figure 2A:
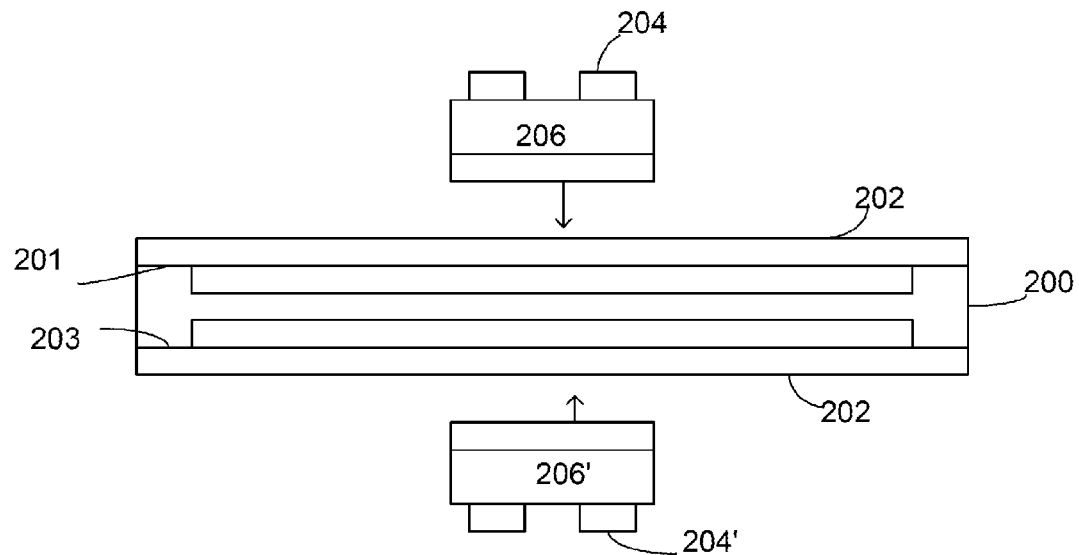
FIGS. 2a-2j represent methods of forming structures according to an embodiment of the present invention.

FIGS. 2a-2j illustrate embodiments of methods of forming microelectronic structures, such as BBUL package structures, for example. FIG. 2a illustrates a carrier material 200. In one embodiment, the carrier material 200 may comprise a multi-layer copper foil that may serve as a carrier, such as a microelectronic die carrier. In other embodiments, the carrier material 200 may comprise any suitable conductive carrier material 200. In an embodiment, the carrier material 200 may comprise an adhesive layer 202, such as a die back side film (DBF) that may be pre-attached to a first side 201 of the carrier 200 and a second side of the carrier 203.

Figure 2B:
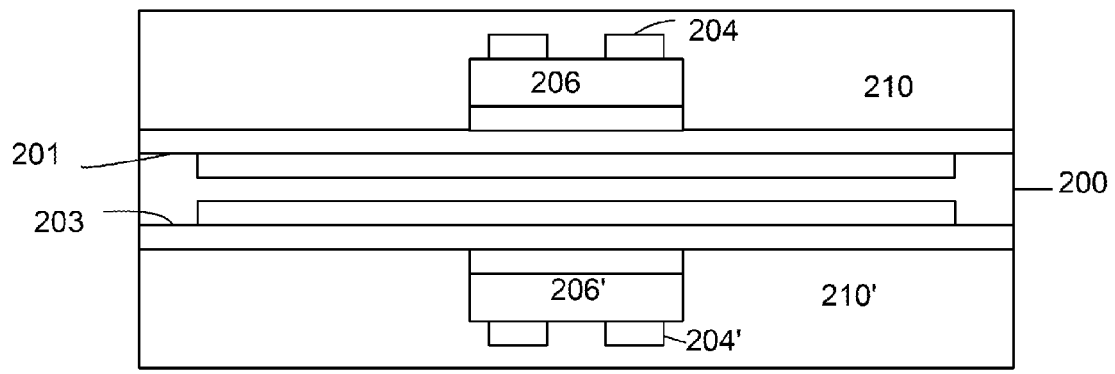

A first die 206, such as a first memory die 206 for example, may be mounted/attached on the first side 201 of the carrier 200 using the pre-attached DBF 202, for example. A second die, such as a second memory die 206', may be attached on the second side 203 of the carrier 200 using the pre-attached DBF 202, for example. The first and second die 206, 206' may comprise conductive structures 204, 204', respectively which may comprise C4 interconnect structures 204, 204', for example. A dielectric material 210 may be placed/laminated on the first side 201 of the carrier 200 (FIG. 2b). A dielectric material 210' may be placed/laminated on the second side of the carrier 203 such that the first die 206 and the second die 206' are fully embedded within the dielectric materials 210, 210' respectively. In an embodiment, the first memory die 206 may serve to be the first embedded die 206 in a BBUL process.

Figure 2C:
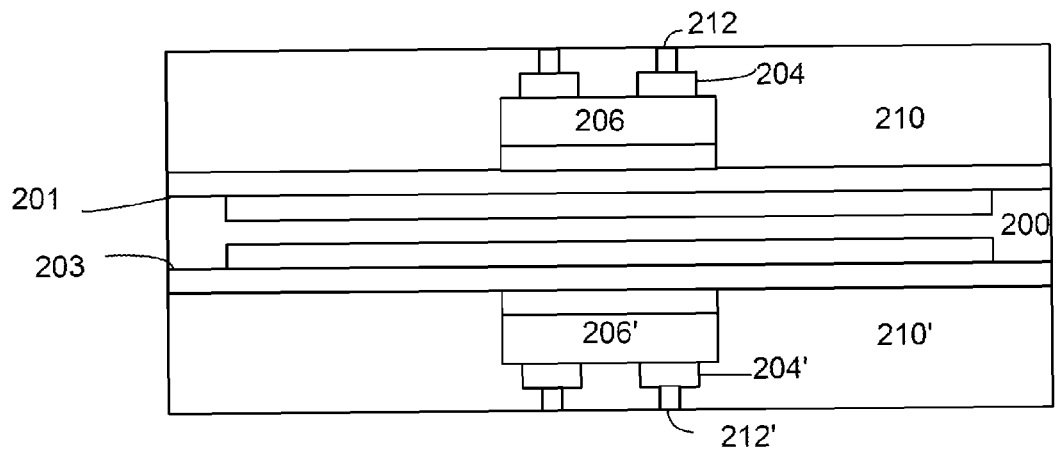

Vias 212, 212' may be formed through the dielectric material 210, 210', by UV/CO2 laser, for example, to expose the conductive structures 204, 204' on the die 206, 206' respectively (FIG. 2c).

Figure 2D:
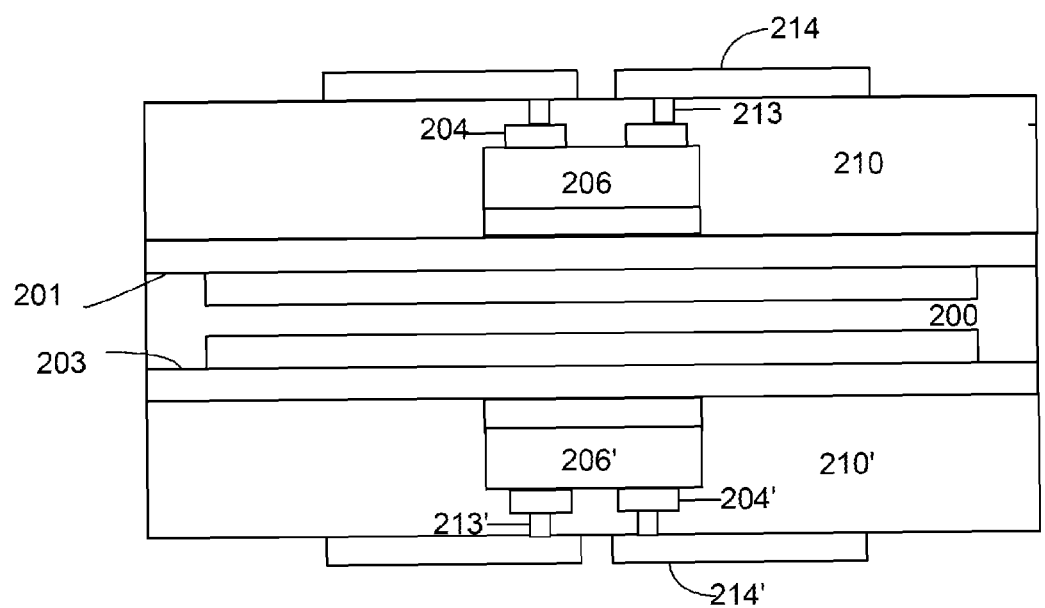

The vias 212, 212' may subsequently be filled with conductive material 213, 213' (FIG. 2d). In an embodiment, a semi-additive process (SAP) may be used to form interconnect structures 214 (which may comprise a first metal layer, for example) to connectively couple to the C4 pads 204 on the first die 206. Interconnect structures 214' may also be formed to connectively couple to the C4 pads 204' of the second die 206'. In an embodiment, the interconnect structures 214 may be disposed on/over the dielectric material 210 and on/over the first die 206, and may be coupled to the C4 pads 204 by the conductive vias 213. The interconnect structures 214' may be disposed on/over the dielectric material 210' and on/over the second die 206', and may be connected to the C4 pads 204' by the conductive vias 213'.

Figure 2E:
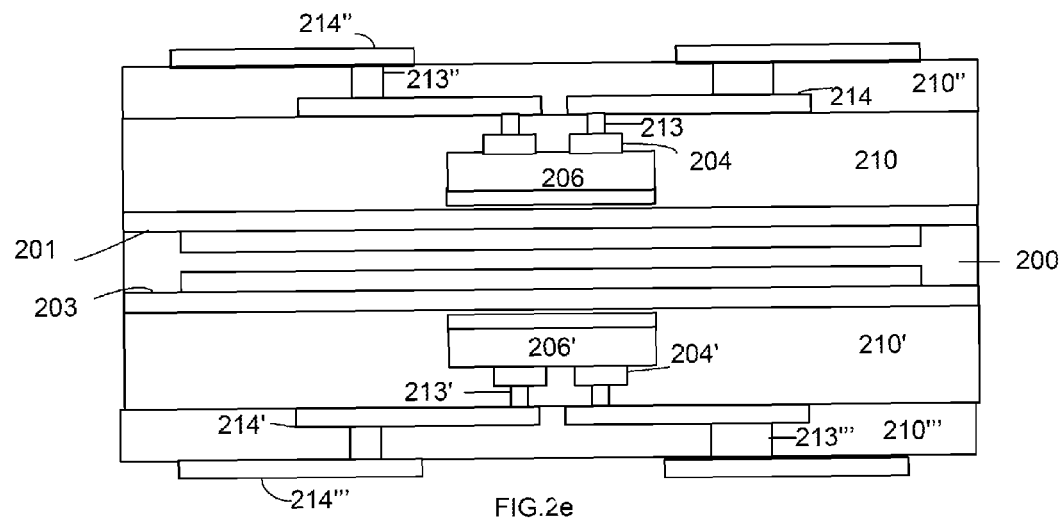
Figure 2F:
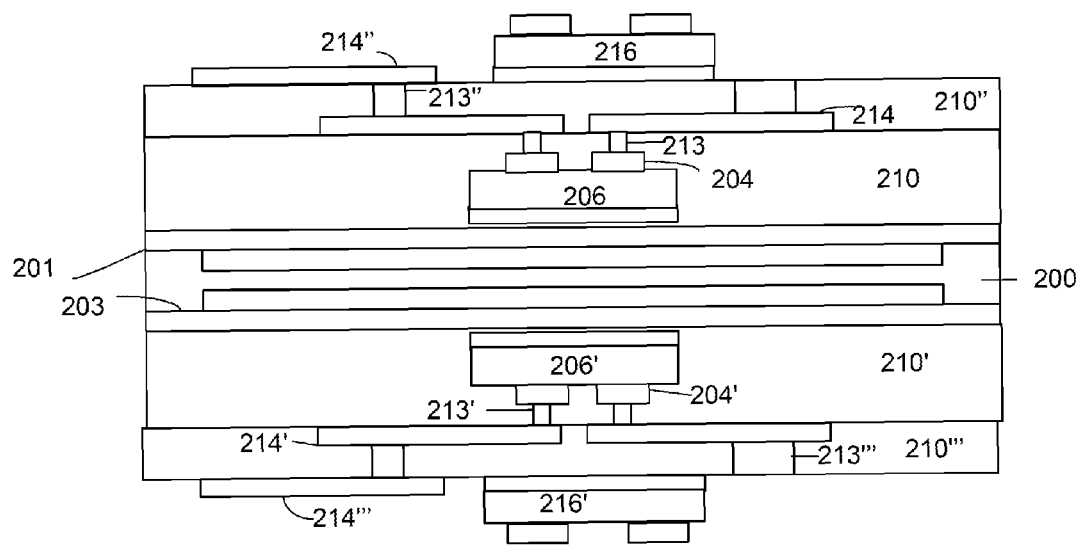
Figure 2G:
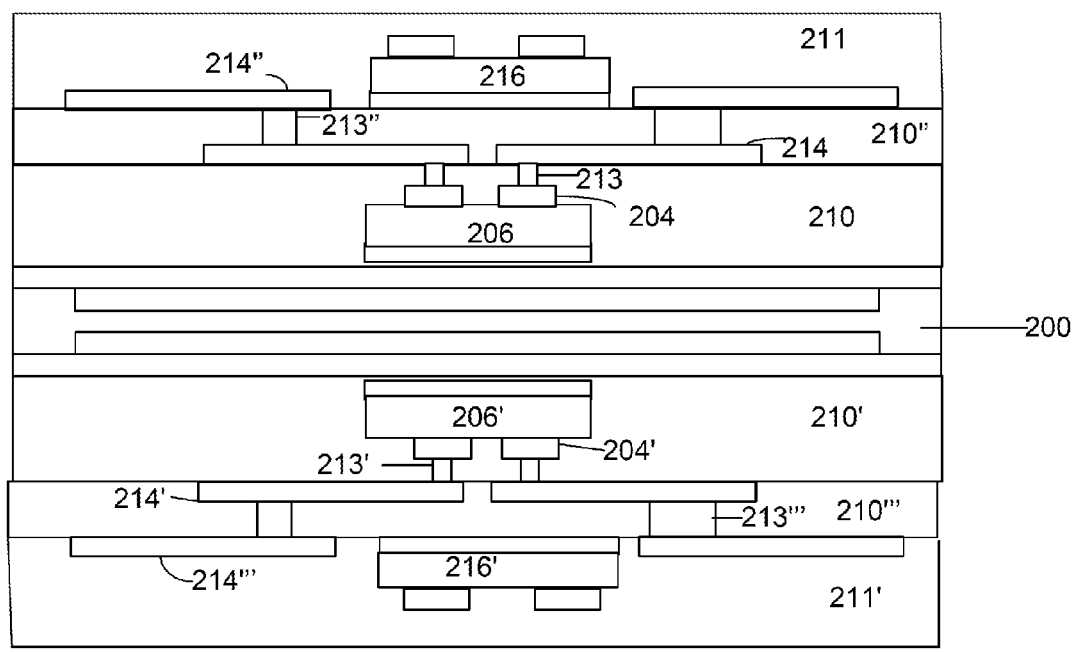

Subsequent layers may then be formed using a SAP build-up processing, for example, wherein further dielectric material 210", 210''', conductive vias 213", 213''' and interconnect structures 214", 214''' may be formed upon each other according to the design requirements of the particular application, by utilizing a SAP buildup process (FIG. 2e). In an embodiment, a third die 216, such as a CPU die 216 may be mounted/attached above the first die 206, on/above the first surface 201 of the carrier 200. A fourth die 216', which may comprise a CPU die, for example, may be attached/mounted above the second die 206' (FIG. 2f). Additional dielectric material 211, 211' may be formed surrounding the third die 216, and the fourth die 216' respectively. Subsequent layers may then be formed using SAP build-up processing, for example, wherein additional conductive vias 213", 213''' and interconnect structures 214', 214''' may be formed upon each other according to the particular design requirements (FIG. 2g). In an embodiment, further vias and metallization layers may be formed on the third and fourth dies 216, 216', according to the particular application, wherein greater than two levels of metallization may be formed utilizing the SAP build-up process.

Figure 2H:
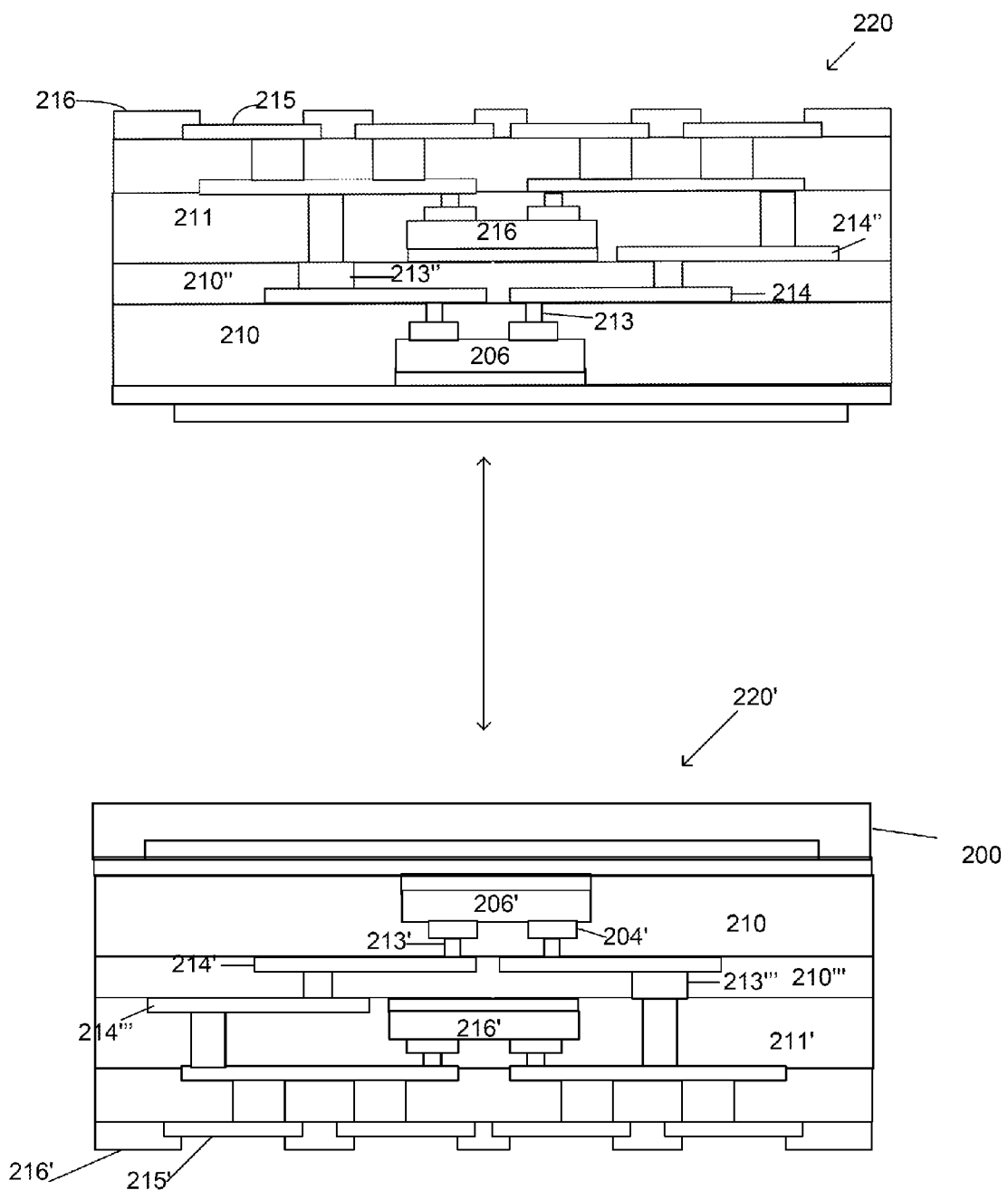

In an embodiment, solder resist 216, 216' can be used/patterned on/above the third and fourth die 216, 216' to open up pads 215, 215' (FIG. 2h). In an embodiment, the first die 206 and the third die 216 may be separated from the second die 206' and the fourth die 216' along the temporary carrier 200 to form a first package structure 220 and a second package structure 220'. In an embodiment, the first and third die 206, 216 may comprise a first BBUL package structure 220 without package on package (PoP) lands after separation from the carrier 200. In an embodiment, the second and fourth die 206', 216' may comprise another, second BBUL package 220' without PoP lands after separation from the carrier 200.

Figure 2I:
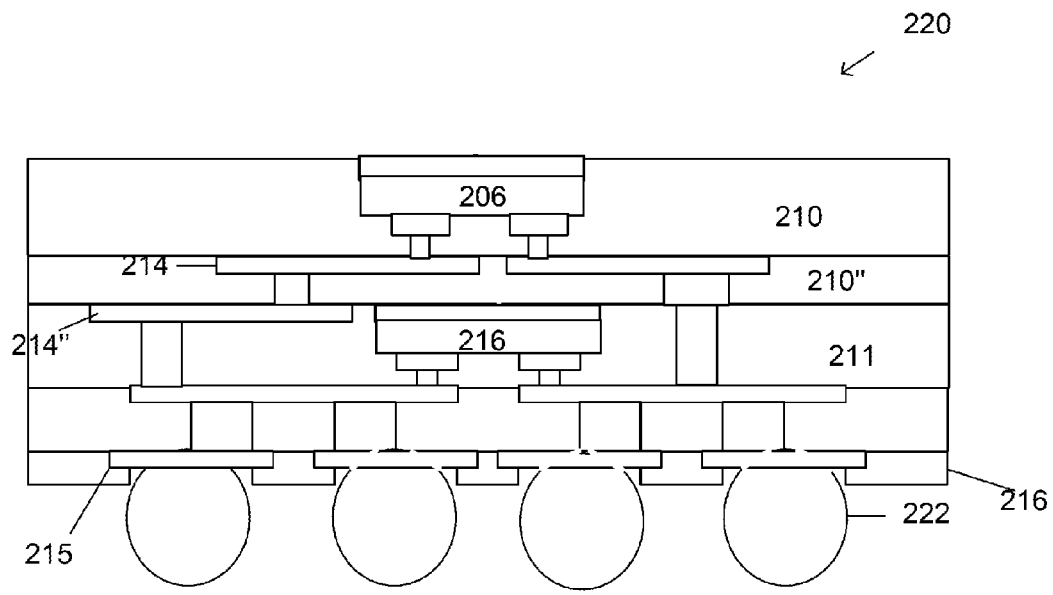

In an embodiment, solder balls 222 may be formed on the pads 215 to couple to the die 206, 216 of the first package 220 (FIG. 2i). Solder balls 222' may be formed on the pads 215' to couple to the die 206', 216' on the second package (not shown). In an embodiment, the solder balls 222 may comprise ball gird array (BGA) balls 222 that may be attached to the package structure 220. Thus, the BBUL package structure 220, wherein there are no PoP lands, may comprise a BBUL coreless package structure 220, and the first and second die 206, 206' may be fully embedded in the coreless BBUL package structure 220.

Figure 2J:
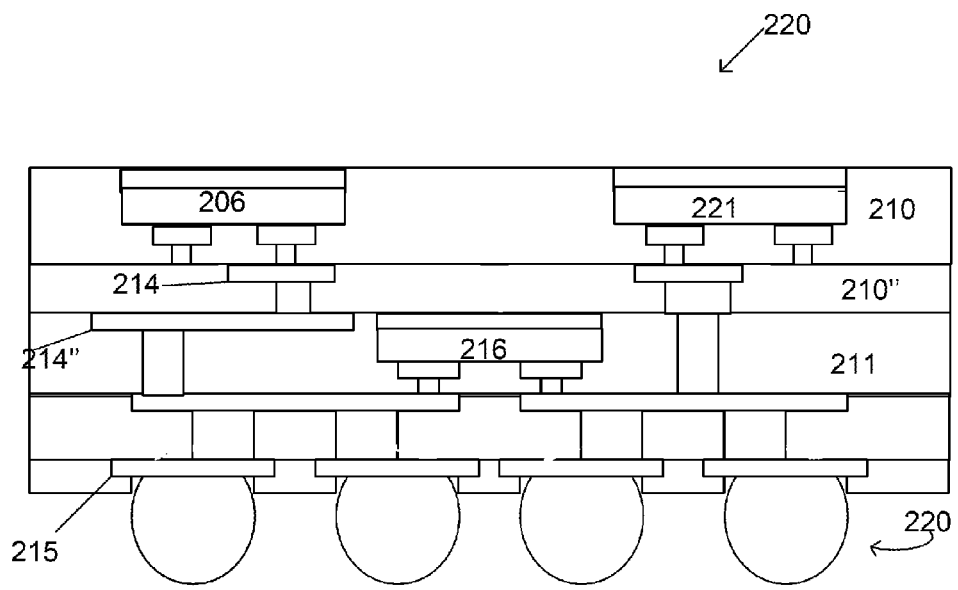

In an embodiment, additional die, such as a fifth 221 and a sixth die 221', for example, may be formed adjacent to the first die 206 in the first package 220 and the third die 206' in the second package 220' (not shown) respectively (FIG. 2j, depicting first package 220). In an embodiment, the fifth die 221 may be disposed in the dielectric material 210 on the first side of the carrier 200 and the sixth die 221' may be disposed in the dielectric material 210' on the second side of the carrier 200 of the second package 220' (not shown).

Thus, embodiments included herein comprise BBUL processes and structures wherein multiple dies are fully embedded within the BBUL package. In an embodiment, the top die, such as a top memory die, may be the first embedded die in the BBUL process of the embodiments herein. Benefits of the embodiments herein include overall cost of processing reduction of the final package, due to the removal of the PoP substrate and a CAM step (such as a memory die attach to PoP package, for example). The overall Z height of the final 'pure', non-PoP land comprising BBUL package may be reduced. PoP package solder joint reliability issues (which may be due to lack of anchoring of the copper PoP pad), may be eliminated. Furthermore, with the embedded stacked die, the BBUL package structures of the various embodiments herein reduce warpage, thus improving the yield during surface mount to a motherboard. The overall package of the various embodiments herein are made completely by the BBUL process alone, rather than by a hybrid process comprising a combination of BBUL package processing and BGA/wire bond package processing as in prior art processes/structures.

Prior art BBUL packages may in fact comprise a combination of a BBUL package and a PoP package, wherein the PoP package is surface mounted onto the BBUL. That is, only the lower package in the prior art is a BBUL process/package and the top PoP package is a non-BBUL package, the top die in the PoP portion not being fully embedded in the BBUL package. The embodiments herein eliminate the PoP package completely. The various embodiments enable packaging, assembly, and/or test solutions for CPU's/processors, chipsets multi-chip/3D packages including CPU in combination with other devices, memory (e.g., flash, DRAM/, RAM/ etc.), boards (e.g., motherboards, etc.).

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as package structures, are well known in the art. Therefore, the Figures provided herein illustrate only portions of an exemplary microelectronic device that pertains to the practice of the present invention. Thus the present invention is not limited to the structures described herein.

What is claimed is:

1. A structure comprising:
   a die embedded in a coreless substrate;
   TSV connection pads on a first side and C4 pads on a second side of the die;
   a mold compound surrounding the die, TSV connection pads and C4 pads;
   a dielectric material on a first side and on a second side of the mold compound; and
   interconnect structures coupled to the C4 pads and to the TSV connection pads.

2. The structure of claim 1 wherein the structure comprises a dual sided package, wherein the die is fully embedded in the dual sided package.

3. The structure of claim 1 wherein the structure comprises a portion of a coreless, bumpless, build up layer package.

4. The structure of claim 3 wherein at least one of a second die and a second package is attached to an outer portion of the package.

5. The structure of claim 1 wherein solder interconnect structures are coupled to the die on an outer portion of the package.

6. A structure comprising:
   a first die embedded in a coreless substrate;
   a first dielectric material adjacent the first die;
   a second die embedded in the coreless substrate, wherein the second die is disposed above the first die;
   a second dielectric material adjacent the second die; and
   interconnect structures connecting the first die to solder connections on an outer portion of the coreless substrate.

7. The structure of claim 6 wherein the first and second die are fully embedded in the coreless package.

8. The structure of claim 6 wherein the coreless substrate comprises a portion of a coreless bumpless buildup package structure.

9. The structure of claim 6 wherein the first die comprises a memory die.

10. The structure of claim 6 wherein the second die comprises a CPU die.

11. The structure of claim 6 wherein at least one additional die is disposed above the first die, adjacent to the second die, wherein the at least one additional die is not attached to the package with PoP lands and is fully embedded in the package.

* * * * *